(12) United States Patent
Stickelmaier et al.

(10) Patent No.: US 9,086,060 B1
(45) Date of Patent: Jul. 21, 2015

(54) TELEMETRY FOR TESTING SWITCH CONFIGURATION IN ION PROPULSION SYSTEM

(71) Applicant: The Boeing Company, Chicago, IL (US)

(72) Inventors: John F. Stickelmaier, Manhattan Beach, CA (US); Philip D. Nguyen, Seal Beach, CA (US)

(73) Assignee: The Boeing Company, Chicago, IL (US)

( * ) Notice: Subject to any disclaimer, the term of this patent is extended or adjusted under 35 U.S.C. 154(b) by 394 days.

(21) Appl. No.: 13/664,635

(22) Filed: Oct. 31, 2012

(51) Int. Cl.
| | |
|---|---|
| *F03H 1/00* | (2006.01) |
| *B64G 1/42* | (2006.01) |
| *B64G 1/40* | (2006.01) |
| *G06F 1/26* | (2006.01) |
| *H02J 9/04* | (2006.01) |
| *H02J 9/06* | (2006.01) |
| *H01R 29/00* | (2006.01) |
| *G01R 19/165* | (2006.01) |

(52) U.S. Cl.
CPC .............. *F03H 1/0018* (2013.01); *H01R 29/00* (2013.01)

(58) Field of Classification Search
CPC ...... F03H 1/0018; B64G 1/428; B64G 1/405; G06F 1/266; H02J 9/04; H02J 9/06; H02J 9/061; H01R 29/00; G01R 19/1659
USPC .............................. 307/18, 38, 113, 125, 130
See application file for complete search history.

(56) References Cited

U.S. PATENT DOCUMENTS

| | | | | |
|---|---|---|---|---|
| 5,898,238 | A * | 4/1999 | Dombrowski | 307/130 |
| 6,297,569 | B1 * | 10/2001 | Bartels et al. | 307/140 |
| 6,597,073 | B1 * | 7/2003 | Check | 307/64 |
| 6,948,305 | B2 * | 9/2005 | Beattie et al. | 60/202 |
| 7,345,378 | B2 * | 3/2008 | Pearce | 307/24 |
| 7,830,042 | B2 * | 11/2010 | Keagy et al. | 307/131 |
| 2003/0038547 | A1 * | 2/2003 | Reinhardt et al. | 307/113 |
| 2010/0134132 | A1 * | 6/2010 | Price et al. | 324/763 |
| 2011/0068819 | A1 * | 3/2011 | Sims et al. | 324/764.01 |
| 2011/0121654 | A1 * | 5/2011 | Recker et al. | 307/66 |
| 2013/0175853 | A1 * | 7/2013 | Chamberlin et al. | 307/9.1 |

FOREIGN PATENT DOCUMENTS

WO    WO2012020190    * 2/2012 ............ F03H 1/00

* cited by examiner

*Primary Examiner* — Phutthiwat Wongwian
*Assistant Examiner* — William Breazeal
(74) *Attorney, Agent, or Firm* — Ostrager Chong Flaherty & Broitman P.C.

(57) ABSTRACT

A relay telemetry system enables an ion propulsion system to self-test the critical relay configuration prior to supplying high-voltage power to any thruster. This test detects whether any critical relay has failed to switch properly or is in the wrong configuration. In the test mode, an onboard computer initiates the application of a low-voltage test voltage (nominally 15 V) to the high-voltage circuits (when the high voltage is off) by a stimulus circuit. Sensing circuits detect the inputs and outputs of the system connections in response to this stimulus. If the test voltage appears on an input or output where it is not expected, then a relay fault has occurred and will be detectable in telemetry sent back to the onboard computer.

21 Claims, 10 Drawing Sheets

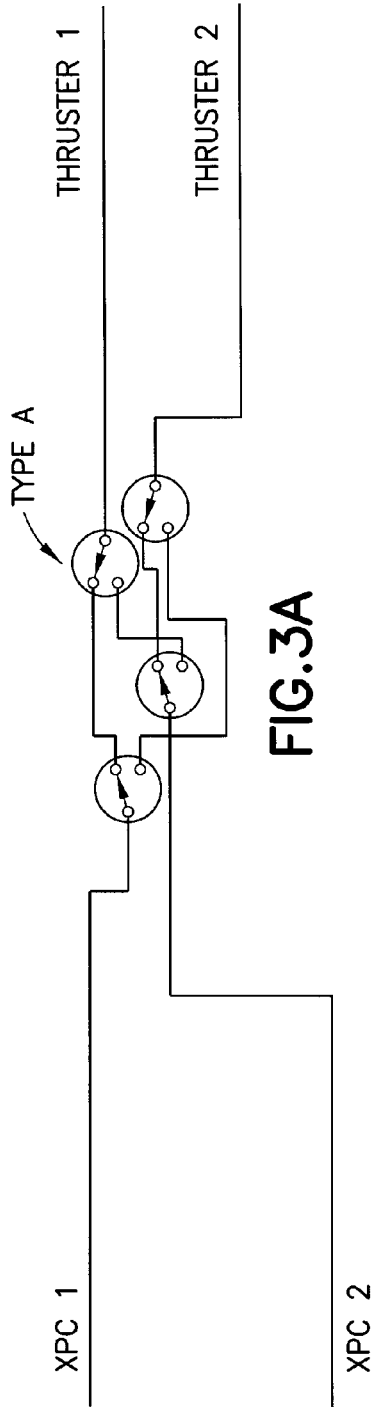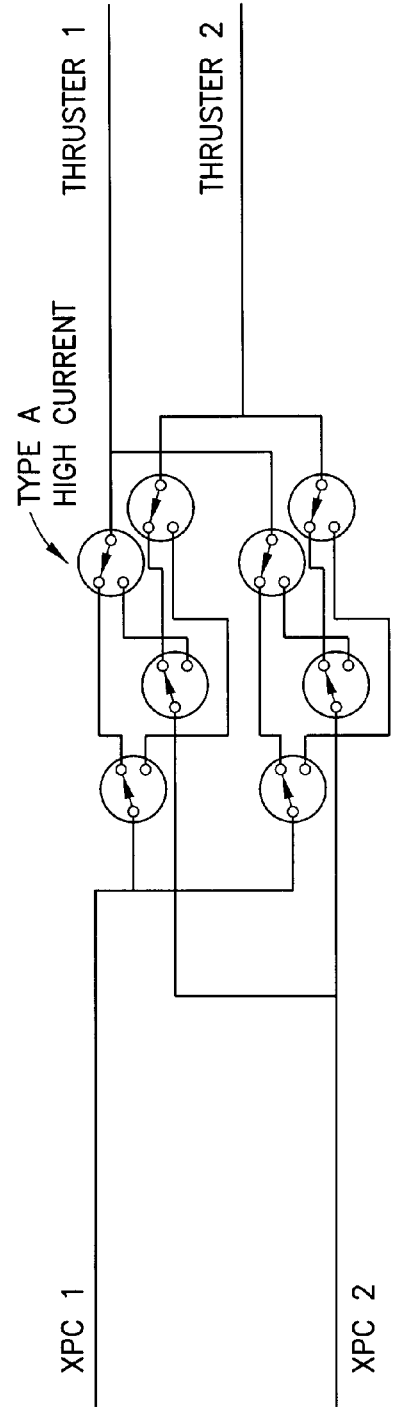

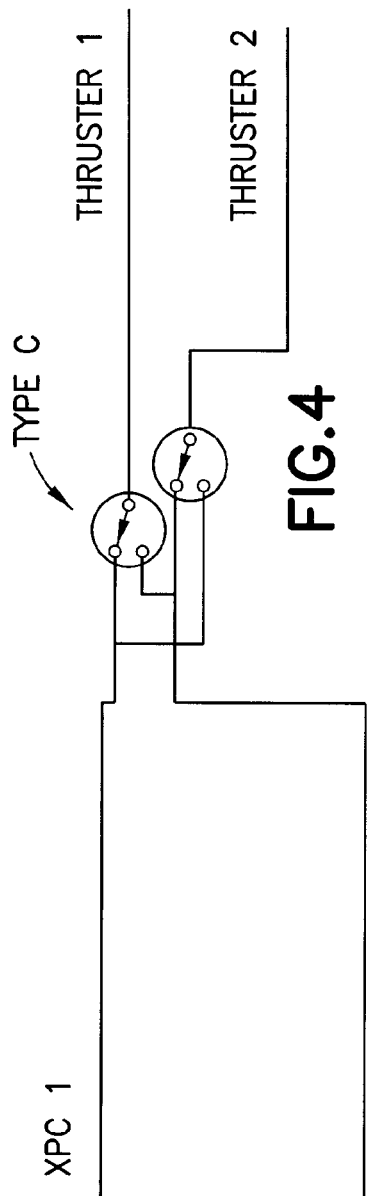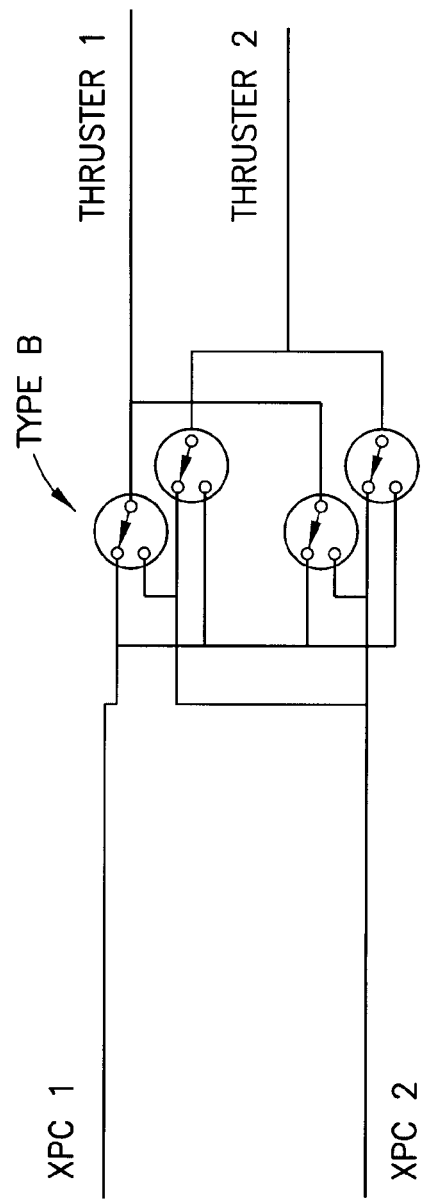

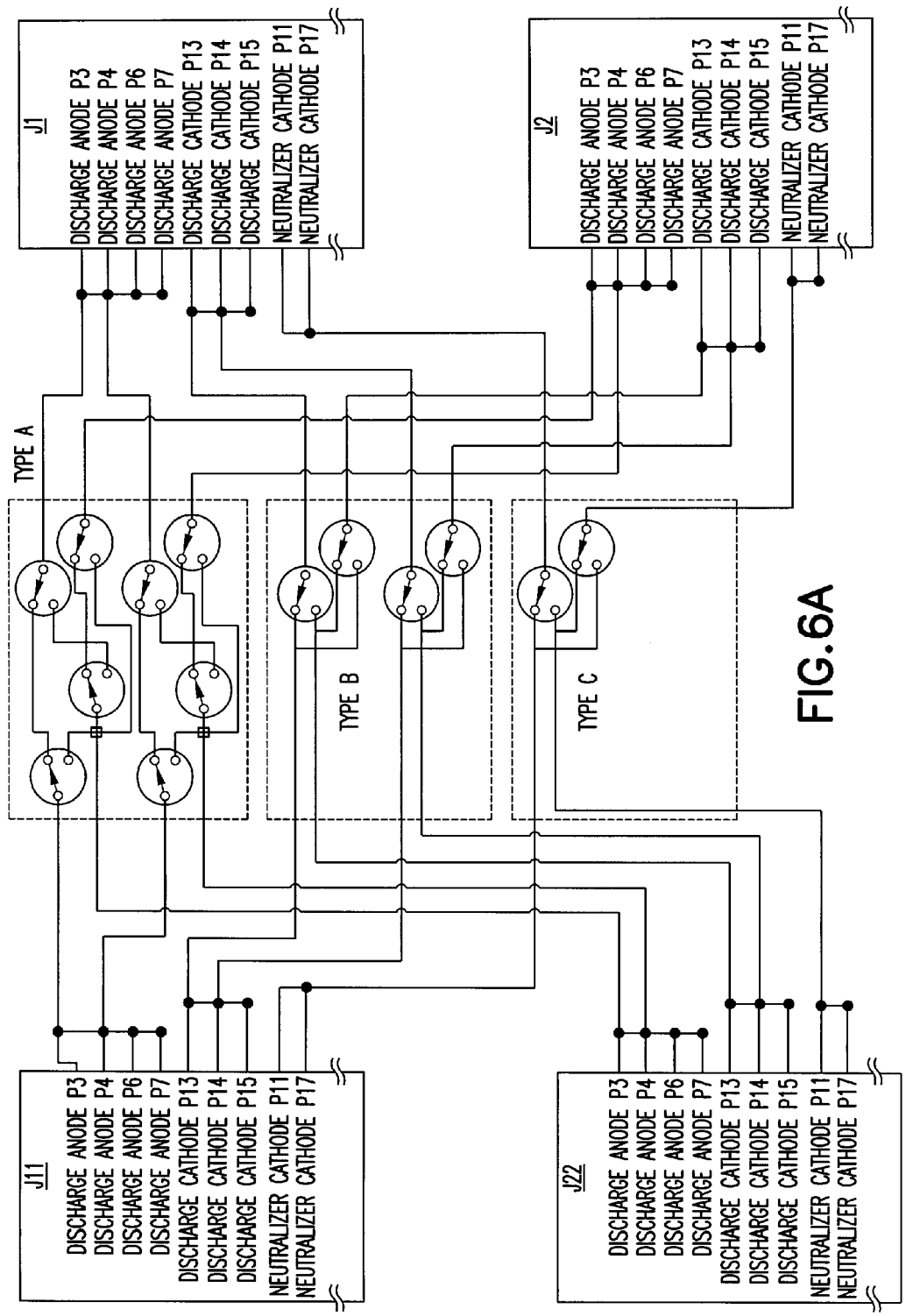

TELEMETRY FOR TESTING SWITCH CONFIGURATION IN ION PROPULSION SYSTEM

BACKGROUND

This disclosure generally relates to apparatus and methods for optimizing the operation of ion thruster arrays.

Ion propulsion generally involves employing an ionized gas accelerated electrically across charged grids to develop thrust. The electrically accelerated particles can achieve very high speeds. The gas used is typically a noble gas, such as xenon. The principal advantage afforded by ion propulsion systems over conventional chemical propulsion systems is their very high efficiency. For example, with the same amount of fuel mass, an ion propulsion system can achieve a final velocity as much as ten times higher than that obtainable with a chemical propulsion system. Although they are efficient, ion propulsion systems develop very low thrust when compared with chemical propulsion systems. This reality has narrowed the range of ion propulsion applications. However, ion propulsion is well suited for space applications where low thrust is often acceptable and fuel efficiency is critical. Many spacecraft, including satellites as well as exploration vehicles, use ion propulsion systems.

For example, spacecraft such as communications satellites now commonly utilize ion propulsion for station keeping and other functions. Ion thrusters utilize electrical power generated by the solar cells of the satellite to supply energy to a propellant to generate the propulsion. In a typical satellite ion thruster, thrust is created by accelerating positive ions through a series of gridded electrodes at one end of a thrust chamber. The electrodes, known as an ion extraction assembly, create thousands of tiny beams of thrust. The beams are prevented from being electrically attracted back to the thruster by an external electron-emitting neutralizer. The power controller is the device which serves to provide electrical control and power to drive the ion thruster, including control of the emission currents in the discharge and neutralizer cathodes.

It is known to use an Xenon Ion Propulsion System (XIPS) to provide thrust for station keeping and transfer orbit of satellites. XIPS uses electricity from the Sun and a working gas to provide propulsion through acceleration of charged ions. A heritage satellite used four ion thrusters (two pairs) and had four separate power processing units (referred to here as "XIPS power controllers" (XPCs)) so that all four thrusters would be capable of being turned on simultaneously. Consequently, this added considerably to the mass required to drive the ion thruster array.

U.S. Pat. No. 6,948,305 disclosed an XIPS comprising a power processing system having reduced mass. That power processing system allowed a single XPC (referred to as a "power processing unit" in that patent) to power a plurality of ion thrusters in an array with the voltage-regulated supplies common to certain elements of the ion thrusters. (The current-regulated supplies have individual outputs so as to provide desired controlled currents to the anodes, keepers and heaters.) The advantage of this approach is mass savings in the voltage-regulated supplies and a significant reduction in the overall packaging mass.

It is further known to equip a satellite with two redundant subsystems, each subsystem comprising one XPC wired to two ion thrusters. The two subsystems are completely independent, but both subsystems can be rendered inoperative if, for example, one subsystem has a thruster problem and the other subsystem has a XPC problem. To address this problem, an XIPS Relay Unit (XRU) was added between the ion thrusters and the XPC. This XRU allowed the ion thrusters and the XPC of the other redundant subsystem to be used. As a result, either XPC could fire any one of four ion thrusters. The addition of the XRU allowed for multiple failures in the XPC and thrusters, while maintaining a working subsystem. All that was required to maintain spacecraft control was thrust from one thruster. Each XRU consisted of a relay bank operated by a relay driver circuit. The ion thrusters and XPC were wired to give maximum redundancy. A known XRU design utilizes up to 36 relays to perform the switching function.

In the event that one of the relays fails to switch properly or is in the wrong configuration, it is possible that all four thrusters will be energized with XPC power. If any one of the four thrusters has an electrical short, then no thruster can be fired. The existing solution is to use daughter relays to indicate the commands were properly sent and a signal pulse was received by the critical relays. In addition, the first turn-on of the ion thruster would determine if a fault has occurred. In addition, one XRU design utilizes redundant relays to protect against a single relay fault on critical circuits.

In the event that a relay fault has occurred, it would be desirable to take corrective action prior to the start of the XIPS operation. There is a need for means for enabling an XIPS to test the critical relay configuration prior to operation of the XIPS so that corrective action can be taken.

SUMMARY

The XRU relay telemetry system disclosed herein comprises circuitry installed in an XRU which enables the XIPS to test the critical relay configuration prior to supplying high-voltage power to any thruster. This test will detect if any of the critical relays in the XRU have failed to switch properly or are in the wrong configuration. In the test mode, the onboard computer initiates the application of a low-voltage test voltage (nominally 15 V) to the high-voltage circuits (when the high voltage is off) by a stimulus circuit installed in the XRU. Sensing circuits installed in the XRU detect the inputs and outputs of the XRU's XIPS connections in response to this stimulus. If the test voltage appears on an input or output where it is not expected, then a relay fault has occurred and will be detectable in the XRU telemetry which is sent back to the onboard computer. The stimulus and sensing circuits are protected through high-voltage resistors, so no damage will occur when the XIPS is fired.

The proposed XRU relay telemetry system allows the XIPS to self-test the XRU relays. If a relay fault has occurred, then the self-test telemetry will be incorrect, i.e., the telemetry output will not match truth table data stored in computer memory onboard the satellite or on the ground. Upon recognition that the telemetry indicates a relay fault, corrective action can be taken prior to the start of XIPS operation. In addition, the self-test will identify which relay of a fault-tolerant circuit has failed to switch. This system provides a positive indication of the XRU relay configuration (i.e., the present state of the switches) prior to firing. In this manner, proper configuration of each XRU can be ensured without risking damage to the XIPS and without having to do a lengthy test burn or other operationally constraining procedure.

One aspect of the subject matter disclosed herein is a method for self-testing by an electronic system that includes a multiplicity of high-voltage switching circuits. The method may comprise: applying a low-voltage test voltage to a respective conductor of each high-voltage switching circuit of the multiplicity in sequence; and sensing the voltages which occur at respective other conductors of the high-voltage switching circuits when the low-voltage test voltages are applied. In accordance with the embodiments disclosed below, the electronic system is onboard an orbiting spacecraft.

Another aspect is a method for detecting the state of each of a multiplicity of high-voltage relays in an electronic circuit. In accordance with this method, each high-voltage relay has at least a first switch state in which a first conductor is connected to a second conductor and a second switch state in which the first conductor is connected to a third conductor. The method comprises the following operations performed by self-testing circuitry incorporated in the electronic circuit: applying a low voltage to the second and third conductors of a relay in sequence; and sensing the voltages at the first conductor of the relay when the low voltage is applied to the second and third conductors.

In accordance with a further aspect, an ion propulsion system is provided, comprising a high-voltage power supply, first and second power controllers, first and second ion thrusters, and a multiplicity of high-voltage relays having first and second switch states. The first and second power controllers are connected to provide high-voltage power to the first and second thrusters respectively when the multiplicity of high-voltage relays are in the first switch state and to the second and first thrusters respectively when the multiplicity of high-voltage relays are in the second switch state. The system further comprises a low-voltage power supply and low-voltage self-test circuitry which is capable of selectively providing low-voltage power to the high-voltage relays of the multiplicity and detecting voltages in respective conductors of the high-voltage relays when the low-voltage power is provided. The ion propulsion system may further comprise a computer system which is connected and programmed to perform the following operations: initiating the selective provision of low-voltage power to the high-voltage relays by the low-voltage self-test circuitry; and processing voltages detected by the low-voltage self-test circuitry when the low-voltage power is provided to the high-voltage relays.

In accordance with one disclosed embodiment, the low-voltage self-test circuitry comprises: a pulse generator; a stimulus circuit connected to receive pulses generated by the pulse generator; a low-voltage switch connected to the low-voltage power supply and controlled by a pulse from the stimulus circuit, wherein first and second high-voltage relays of the multiplicity of high-voltage relays receive a low-voltage pulse from the low-voltage power supply when the low-voltage switch is turned on by the pulse from the stimulus circuit; first and second sensing circuits for detecting respective voltages in respective conductors of the first and second high-voltage relays when the low-voltage pulse is received by the first and second high-voltage relays; and a telemetry output circuit connected to the first and second sensing circuits. The stimulus circuit may comprise a first multiplexer having an input terminal connected to the pulse generator and first and second output terminals respectively connected to the first and second low-voltage switches. The telemetry output circuit may comprise an output terminal and first and second input terminals respectively connected to the first and second sensing circuits. The system may further comprise high-voltage resistors which protect the stimulus and sensing circuits.

A broader aspect of the disclosed subject matter is an electronic system capable of delivering high-voltage power to either of first and second electronic devices, comprising: a multiplicity of high-voltage switching circuits having a first switch configuration for use when the high-voltage power is to be delivered to the first electronic device or a second configuration for use when the high-voltage power is to be delivered to the second electronic device; a low-voltage power supply; and low-voltage self-test circuitry which is capable of selectively providing low-voltage power to the high-voltage switching circuits and detecting voltages in respective conductors of the high-voltage relays when the low-voltage power is provided. The foregoing electronic system may further comprise a computer system which is connected and programmed to perform the following operations: initiating the selective provision of low-voltage power to the high-voltage switching circuits by the low-voltage self-test circuitry; and processing voltages detected by the low-voltage self-test circuitry when the low-voltage power is provided to the high-voltage switching circuits. In accordance with the embodiments disclosed hereinafter, the high-voltage switching circuits comprise relays.

Other aspects are disclosed and claimed below.

BRIEF DESCRIPTION OF THE DRAWINGS

FIGS. 3A and 3B are circuit diagrams respectively showing a Type A relay configuration and a Type A High Current relay configuration.

FIGS. 4 and 5 are circuit diagrams respectively showing a Type C relay configuration and a Type B relay configuration. The Type B configuration is a high-current version of the Type C configuration.

FIGS. 6A and 6B are schematics showing one set of nine power connections for an XRU in accordance with one embodiment wherein different types of relay configuration are employed in the same XRU.

Reference will hereinafter be made to the drawings in which similar elements in different drawings bear the same reference numerals.

DETAILED DESCRIPTION

An ion propulsion system is disclosed having two XIPS power controllers (XPCs), two XIPS relay units (XRUs), and four ion thrusters. Each of the four ion thrusters can be fired by either XPC by properly configuring the XRUs and XPCs. Another way to state this is that the system will allow any thruster to be fired by either XPC. This will be done on station when only one thruster is fired at a time. However, if proper satellite operation requires that two thrusters be fired at the same time, the disclosed system allows either of the two XPCs to fire any two of the four ion thrusters. The system can select which two thrusters to fire and then decide which XPC will fire which thruster by properly configuring the XRUs and XPCs. One XPC can only operate one thruster at a time. So whenever two thrusters are to be fired at the same time, both XPCs must be utilized. The presence of a pair of XRUs allows for multiple failures in both the XPCs and ion thrusters. All that is required to maintain spacecraft control is thrust from one ion thruster.

Figure 1:
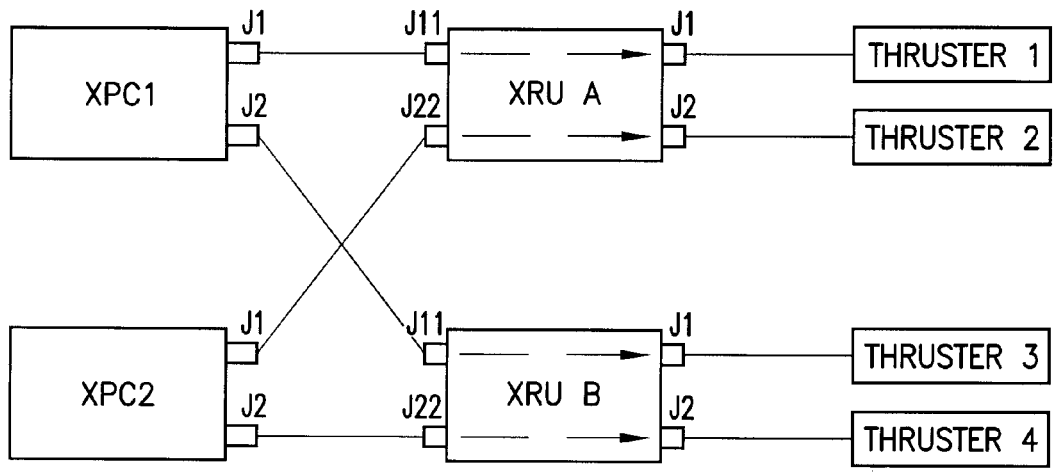
FIGS. 1 and 2 are diagrams showing two XRU modes, including a normal mode (FIG. 1) and a cross strapped mode (FIG. 2).
Figure 2:
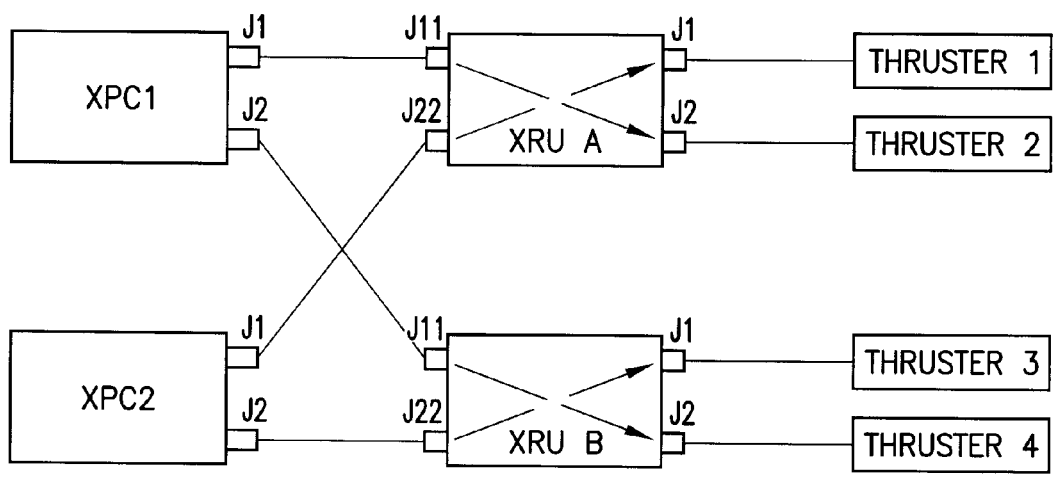

FIGS. 1 and 2 are diagrams showing some (but not all) modes of a pair of XRUs (XRU A and XRU B) which are arranged to allow various thrusters to be connected to two XPCs for extra redundancy. In each of FIGS. 1 and 2, the following connections are fixed: connector J1 of XPC1 is connected to connector J11 of XRU A; connector J2 of XPC1 is connected to connector J11 of XRU B; connector J1 of XPC2 is connected to connector J22 of XRU A; connector J2 of XPC2 is connected to connector J22 of XRU B; connector J1 of XRU A is connected to Thruster 1; connector J2 of XRU A is connected to Thruster 2; connector J1 of XRU B is connected to Thruster 3; and connector J2 of XRU B is connected to Thruster 4.

FIG. 1 shows a normal mode wherein the relays of XRUs A and B are configured to cause input connectors J11 and J22 of each XRU to be connected to output connectors J1 and J2 respectively, as a result of which Thrusters 1 and 3 can receive power from XPC1 and Thrusters 2 and 4 can receive power from XPC2.

FIG. 2 shows a cross strapped mode wherein the relays XRUs A and B are configured to cause input connectors J11 and J22 of each XRU to be connected to output connectors J2 and J1 respectively, as a result of which Thrusters 1 and 3 can receive power from XPC2 and Thrusters 2 and 4 can receive power from XPC1.

In addition, it is possible (although not shown in FIGS. 1 and 2) that one XRU is in the normal configuration and the other is in the cross strapped configuration.

The basic structure and operation of an ion thruster for use on satellites are well known and will only be briefly described here. Each ion thruster includes an ion extraction assembly, a housing which forms an ionization chamber, a discharge electron source and an electrode system which are positioned within the chamber, a magnetic field generator which is also positioned within the chamber, and a neutralizer positioned adjacent the ion extraction assembly. The ion thruster is coupled to a vessel which contains an ionizable gas (e.g., xenon) and a power supply system.

In a basic operation of an ion thruster, the ionizable gas of the vessel is supplied to the chamber via a valve and primary electrons are injected into the gas from the electron source. A discharge voltage applied to the electrode system accelerates these electrons into collisions with gas atoms to generate a plasma. The magnetic field generator typically includes annular permanent magnets and is configured to develop magnetic flux lines proximate to the housing. These flux lines direct electrons along extended paths and thus enhance the generation of the plasma. In accordance with one embodiment, the ion extraction assembly has a screen grid, an accelerator grid and a decelerator grid (the decelerator grid is optional). Electrical power from the power supply system is applied to the grids to cause the ion extraction assembly to extract an ion beam from the plasma and accelerate it away from the thruster. The ion beam generates a force upon the ion thruster and spacecraft to which it is attached.

If not otherwise compensated, the positive charge flow of the ion beam would develop a negative charge on the ion thruster that would degrade the thruster's force. Accordingly, the neutralizer injects an electron stream into the proximity of the ion beam to offset its charge-depleting effects. The electron stream also partially neutralizes the positive space charge of the ion beam to prevent excessive beam divergence.

As is well known in the art of xenon ion propulsion, each XRU comprises nine different circuits required to provide power from one XPC to one thruster, each circuit being capable of forming respective electrical connections between the XPC and the thruster. The electrical connections are made by controlling the states of the relays incorporated in each circuit.

More specifically, it is known that a typical XPC comprises a screen power supply, an accelerator power supply and a decelerator power supply, each of which is a voltage-regulated power supply. The typical XPC further comprises a discharge power supply, discharge keeper and heater power supplies, and neutralizer keeper and heater power supplies, all of which are current-regulated power supplies.

The discharge electron source of a typical ion thruster comprises a cathode, a keeper electrode and a heater which, when proper electrical connections have been made, receive current from the discharge heater power supply of the XPC. The discharge keeper power supply of the XPC places a positive voltage on the thruster keeper electrode to initiate a plasma discharge and provide electrons to the ionization chamber. The electrode system of the thruster includes a discharge cathode and a discharge anode. A discharge voltage is placed across the electron source and the discharge anode of the thruster by the discharge supply of the XPC to accelerate the primary electrons through the ionizable gas. The accelerator power supply accelerates ions out of the thruster. The thruster neutralizer (not shown) includes a neutralizer cathode, a keeper electrode and a heater which are substantially the same as the discharge cathode, discharge keeper electrode and discharge heater that are positioned in the ionization chamber. A neutralizer heater power supply of the XPC is coupled across the neutralizer heater to generate an electron supply and a neutralizer keeper power supply of the XPC places a positive voltage on the neutralizer keeper electrode to initiate a plasma which is the source of the electron stream.

The typical XPC further comprises a lower supply bus and an upper supply bus. The lower supply bus is referenced to a spacecraft "ground" and the potentials of these supply buses are electrically separated by the voltage differential of the screen power supply. The lower supply bus references the neutralizer keeper power supply, the neutralizer heater power supply, the accelerator power supply and the decelerator power supply. A Zener diode in the lower supply bus allows it to float negative with respect to the spacecraft potential to realize a potential which causes the electron stream to equalize the ion beam. The upper supply bus references the discharge power supply, the discharge keeper power supply, the discharge heater power supply and the screen grid to the discharge electron source. The discharge power supply is coupled to the discharge anode of the thruster to provide ionizing power to the fuel (e.g., xenon) and the screen power supply is coupled to the discharge cathode of the thruster to drive the main beam.

All of the above-described electrical connections between XPCs A and B and Thrusters 1-4 are made and broken by XRUs comprising sets of relay which may have different configurations. In accordance with one embodiment, each XRU uses relays configured in one of three different configurations. The configuration that is used for each circuit depends on current requirement and severity of damage if a relay failure were to occur. The sample configurations shown in FIGS. 3A, 3B, 4 and 5 are for one circuit and exclude redundant wires from connector(s).

FIG. 3A shows a Type A relay configuration, while FIG. 3B shows a high-current version of the Type A relay configuration. The Type A and Type A High Current relay configurations have identical effects, so they will be treated herein as the same configuration. As seen in FIG. 3A, the Type A relay configuration consists of four relays connected as shown. As seen in FIG. 3B, the Type A High Current relay configuration consists of eight relays connected as shown. When the relays are switched to the normal mode, XPC1 will be electrically connected to Thruster 1, while XPC2 will be electrically connected to Thruster 2. When the relays are switched to the cross strapped mode, XPC1 will be electrically connected to Thruster 2, while XPC2 will be electrically connected to Thruster 1.

FIG. 4 shows a Type C relay configuration. The Type C configuration is the simplest and has fewer damaging effects in a failure case. As seen in FIG. 4, the Type C relay configuration consists of two relays connected as shown. Again, depending on the states of the two relays, XPC1 and XPC2 can be electrically connected to Thrusters 1 and 2 either in the normal mode or the cross strapped mode.

FIG. 5 shows a Type B relay configuration. The Type B configuration is a high-current version of the Type C configuration, but has additional fault modes. As seen in FIG. 5, the Type B relay configuration consists of four relays connected as shown. Again, depending on the states of the four relays, XPC1 and XPC2 can be electrically connected to Thrusters 1 and 2 either in the normal or cross strapped mode.

Figure 6B:
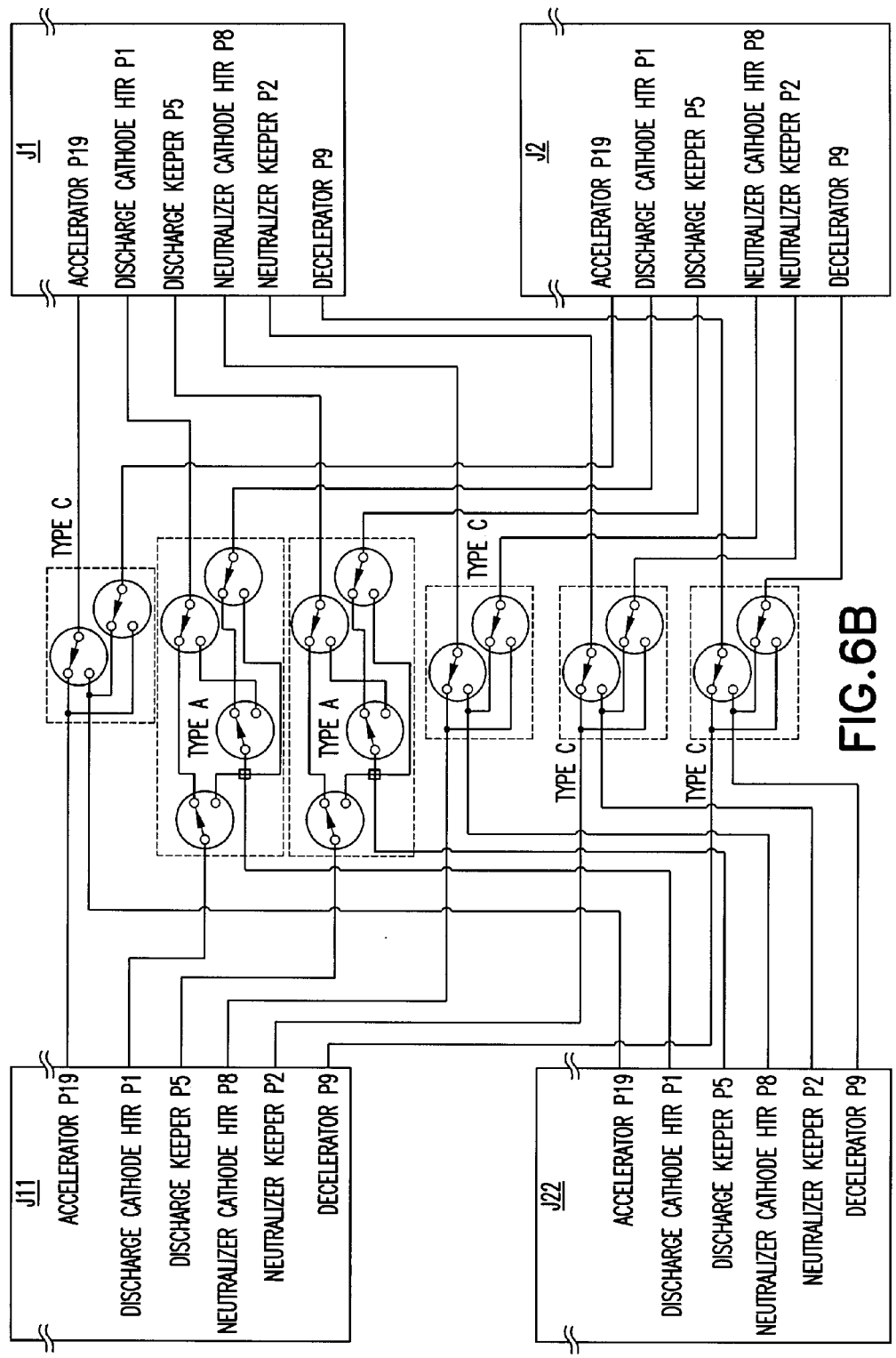

FIGS. 6A and 6B show one set of nine power connections for an XRU in accordance with one embodiment in which different types of relay configuration are employed in the same XRU. All relays are in the normal mode. As seen in FIG. 6A, the power connection for the discharge anode consists of a set of eight relays arranged in a Type A High Current configuration; the power connection for the discharge cathode consists of a set of four relays arranged in a Type B configuration; and the power connection for the neutralizer cathode consists of two relays arranged in a Type C configuration. As seen in FIG. 6B, the power connections for the accelerator, neutralizer cathode heater, neutralizer keeper and decelerator consist of respective sets of two relays arranged in a Type C configuration; and the power connections for the discharge cathode heater and discharge keeper consist of respective sets of four relays arranged in a Type A configuration. In the normal mode, the relays are set to states such that connector J11 is connected to connector J1, while connector J22 is connected to connector J2. Conversely, in the cross strapped mode, the relays are set to states such that connector J11 is connected to connector J2, while connector J22 is connected to connector J1.

If extra series relays were not utilized on the critical circuits, then a single relay that failed to switch when commanded will allow leakage of the high voltage to the other XPC and thrusters. Depending on the configuration, this leakage of high voltage could cause undesirable electrical overstress.

During operation of the XIPS, each XPC is always electrically connected to two thrusters even though the XPC only fires one thruster at a time. In order for the proper thruster to fire, three things are needed: (1) power from the XPC; (2) xenon gas flow; and (3) preheat. Only the thruster that is being fired will have gas flow and preheat. The thruster that is not being fired will have power from XPC, but not the required gas flow and preheat. If the thruster that is not being fired develops a short, the XPC will not be able to provide sufficient power to the thruster that is supposed to be firing.

Figure 7:
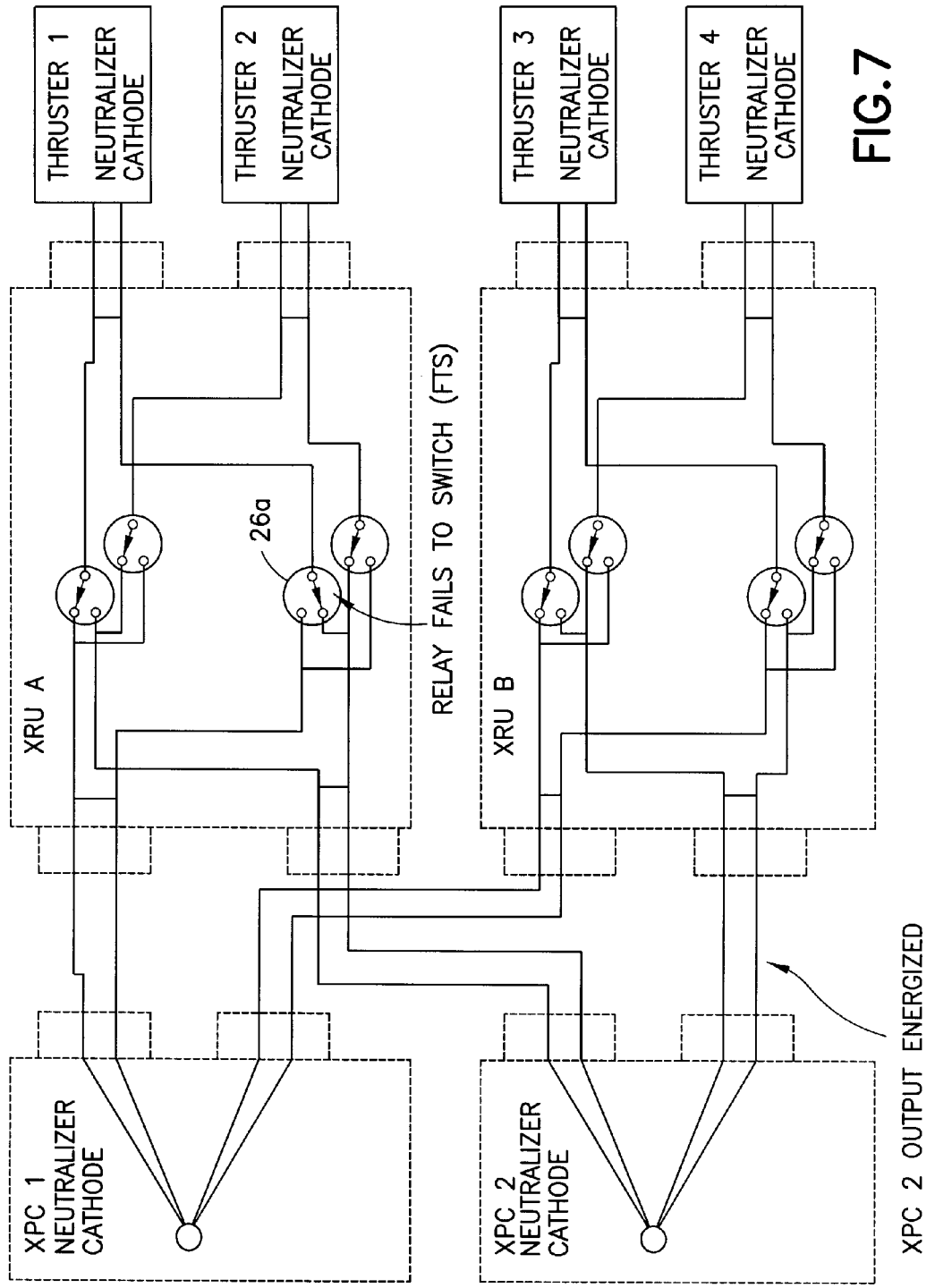
FIG. 7 is a schematic showing neutralizer cathode power connections from two XPCs to four thrusters via two XRUs (in the normal mode) when one XRU is in an FTS (failed to switch) fault mode.
Figure 8:
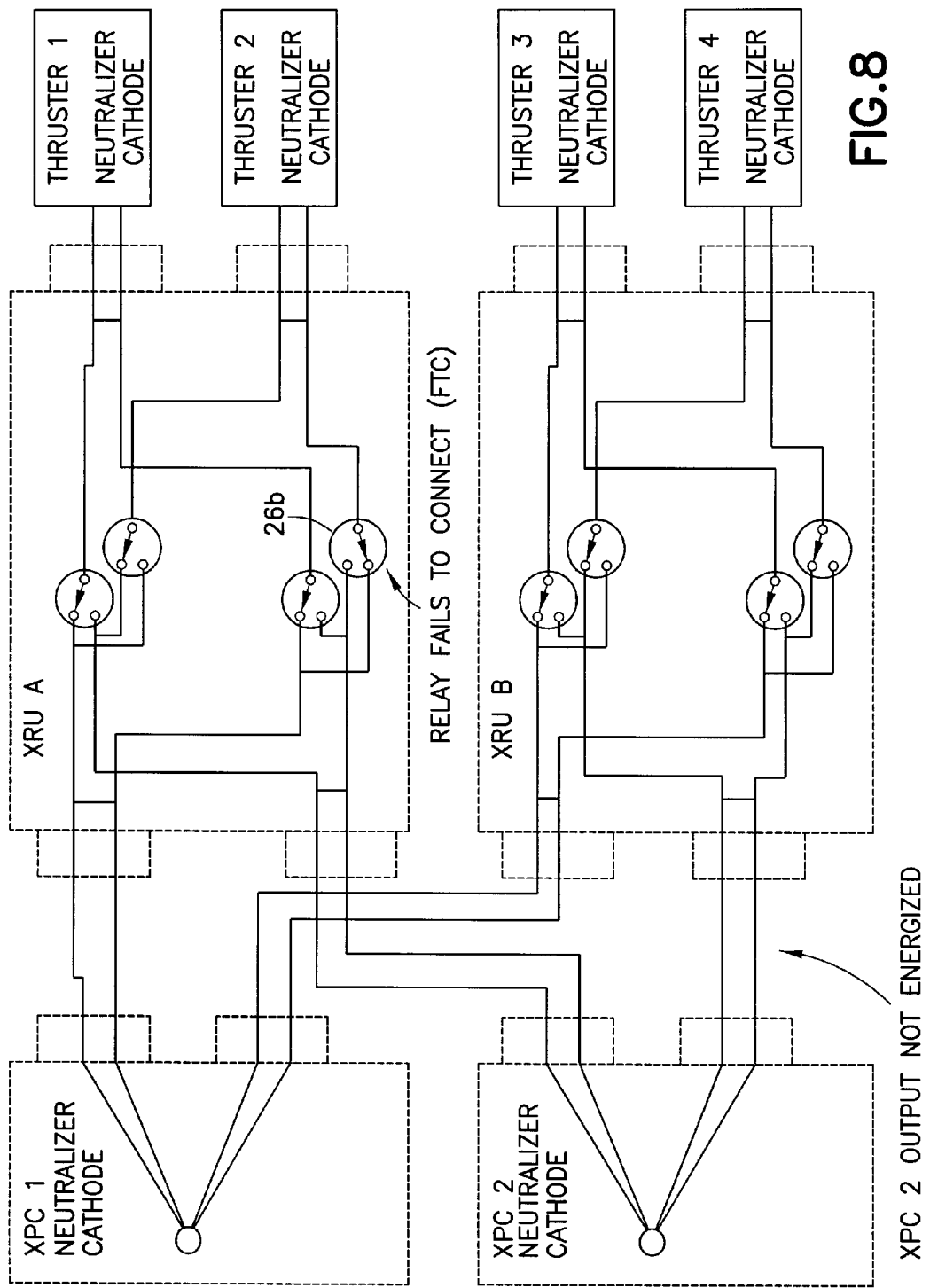
FIG. 8 is a schematic showing neutralizer cathode power connections from two XPCs to four thrusters via two XRUs (in the normal mode) when one XRU is in an FTC (failed to connect) fault mode.

In accordance with one embodiment, relay telemetry is implemented using a low-voltage self-test circuit. This test circuit will be installed on all of the XIPS circuits (i.e., discharge anode, discharge cathode, discharge keeper, discharge heater, neutralizer cathode, neutralizer keeper, neutralizer heater, decelerator and accelerator). For the purpose of illustration, FIG. 7 shows neutralizer cathode power connections from two XPCs to four thrusters via XRUs A and B (in the normal mode) when one of the relays 26a (of a Type C configuration) has failed to switch (i.e., the relay contact has not moved), while FIG. 8 shows the same power connections when one relay 26b has failed to connect (i.e., the relay contact has moved only part way). If relay 26a shown in FIG. 7 fails to switch, all four thrusters can be energized with power from XPC 1. If any one of these four thrusters has an electrical short, then no thruster can be fired. The purpose of adding XRU relay telemetry is to provide means for reading relay status directly to determine if a relay has failed to switch, as shown in FIG. 7. Telemetry is not provided for a relay that has failed to connect. In the latter case, the thruster can still be fired, but with loss of redundant path.

Figure 9:
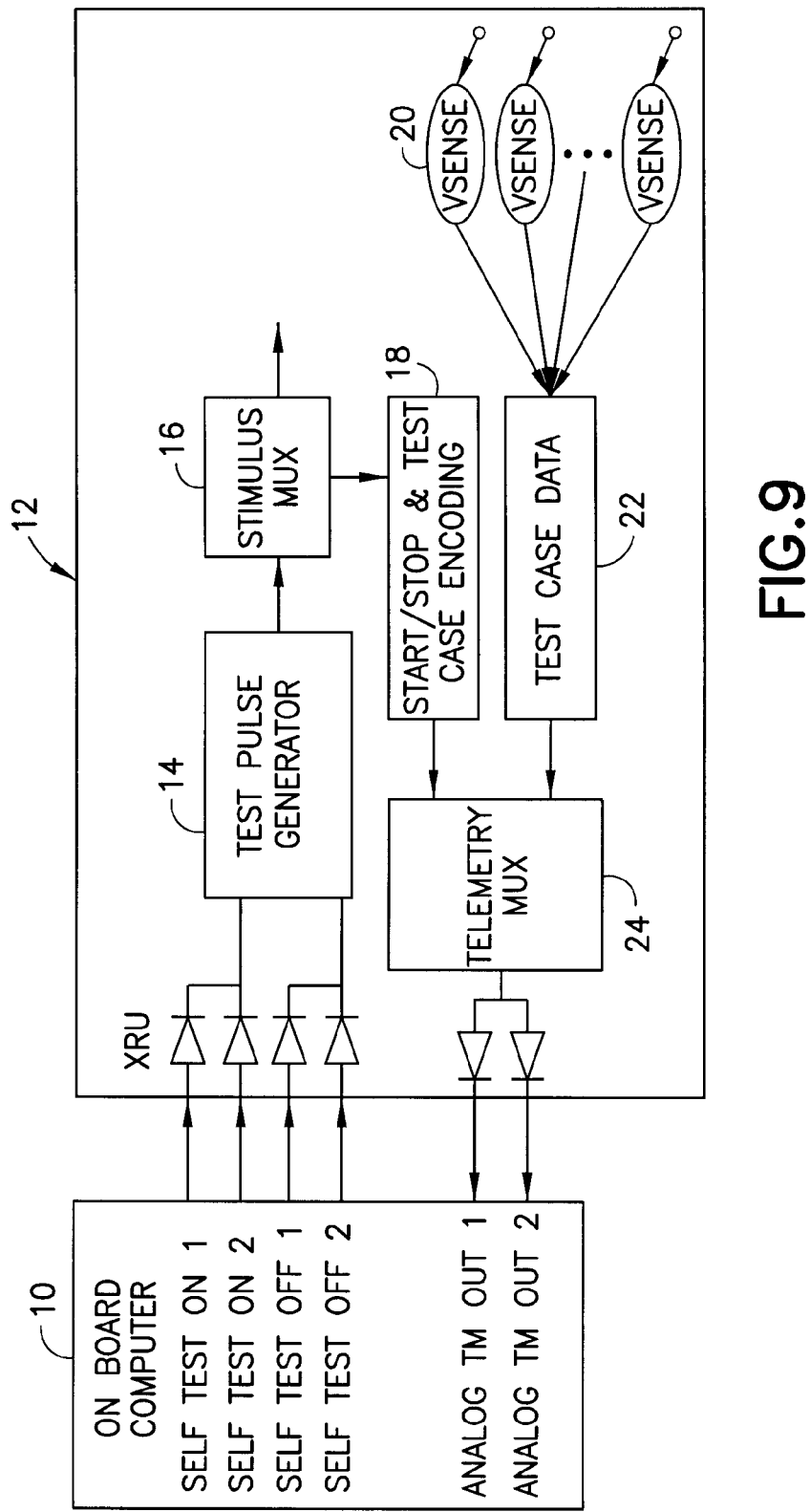
FIG. 9 is a block diagram showing the interface between the onboard computer and an XRU in accordance with one embodiment of a relay telemetry system for testing.

In accordance with the embodiments disclosed herein, the telemetry is initiated by an onboard computer. FIG. 9 shows the interface between the onboard computer 10 and an XRU 12. Each XRU is provided with a low-voltage self-test circuit comprising the following hardware components for performing the circuit test function: a test pulse generator 14, a stimulus multiplexer (MUX) 16 and a telemetry multiplexer (MUX) 24. The self-test feature is initiated by a command from the onboard computer 10 (output from either port labeled "Self Test On" in FIG. 9). The command is sent while the XPCs and thrusters are turned off. In response to such a command, test pulse generator 14, which comprises an internal timer, generates test pulses and increments the stimulus MUX 16 to generate each test case. The test pulses are output by the stimulus MUX 16 to control the application of the test voltage to the respective XRU power connection circuits.

Still referring to FIG. 9, the self-test circuitry further comprises a multiplicity of voltage sensing circuits 20 which measure the voltages on the XRU inputs and outputs when a test voltage pulse is applied to any pair of relays. If both relays receiving the low-voltage test pulse are closed, the associated sensing circuits 20 will both sense the test voltage; if one of the two relays receiving the low-voltage test pulse has failed to switch to a closed position, one of the associated sensing circuits will sense the test voltage applied to the closed relay, white the other sensing circuit will sense zero voltage due to the open relay. This provides means for directly reading the relay status to determine if any relay has failed to switch. For each set of four relays, this test is repeated four times, once for each of the four switch states of that four-relay set.

Figure 10:
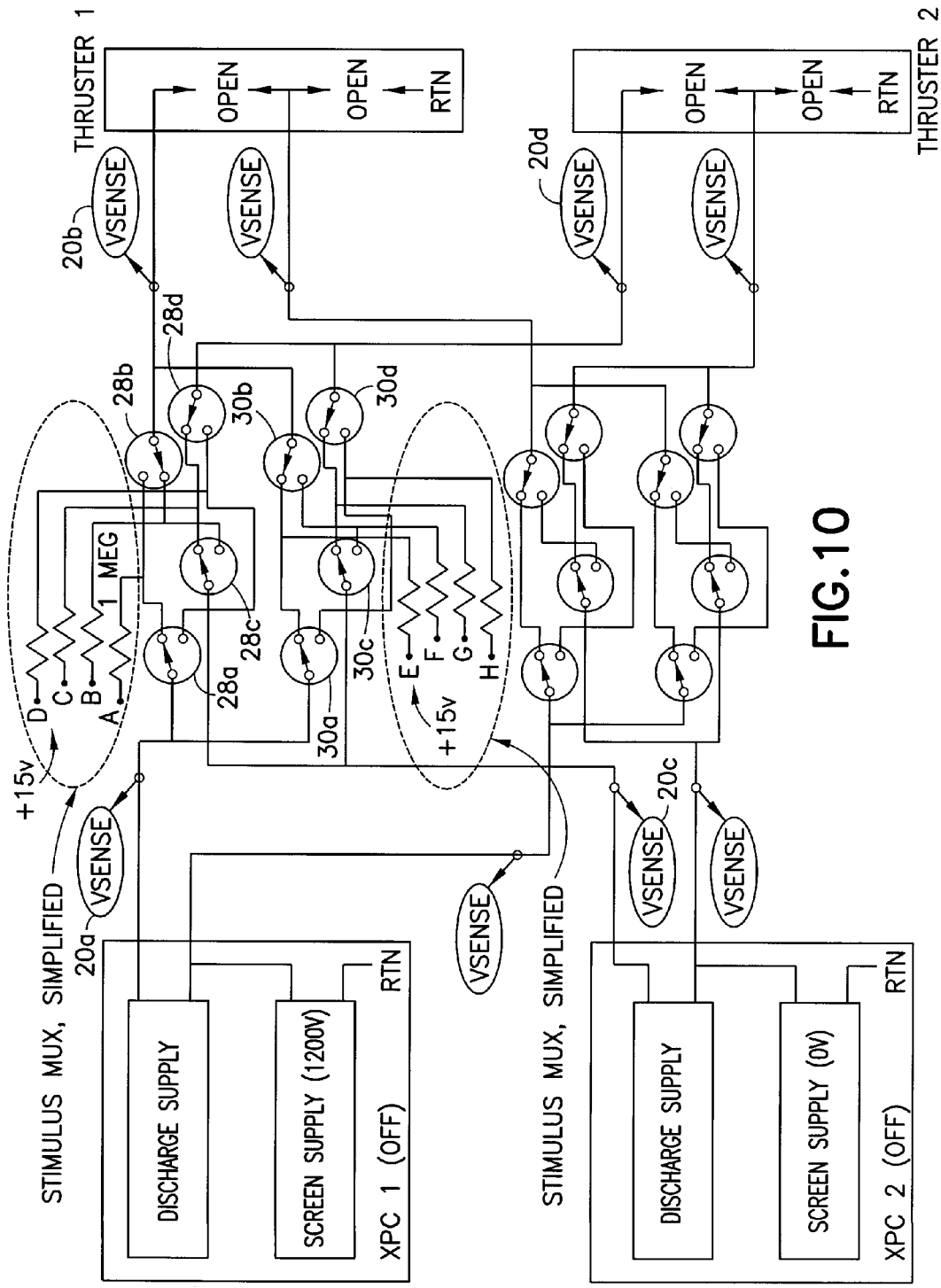
FIG. 10 is a schematic showing portions of a test circuit installed in a discharge anode power connection circuit of an XRU when one relay has failed to switch.

To illustrate the foregoing aspect, the reader's attention is directed to FIG. 10, which shows portions of a test circuit installed in a discharge anode power connection circuit of an XRU when one relay 28b has failed to switch. A simplified representation of the 15-V test voltage being applied by a stimulus MUX having terminals A through H that respectively connect to the uppermost set of eight relays is included within a pair of dashed ellipses. Similarly, the lower eight relays are connected to eight other output terminals (not shown) of a stimulus MUX incorporated in the other XRU.

In accordance with the embodiment shown in FIG. 10, eight outputs (A through H) of a stimulus MUX are connected to different inter-relay conductors of an eight-relay Type A High Current relay configuration that includes relays 28a-28d and 30a-30d. Output A is connected to the conductor which connects relays 28a and 28b to each other; output B is connected to the conductor which connects relays 28b and 28c to each other; output C is connected to the conductor which connects relays 28c and 28d to each other; output D is connected to the conductor which connects relays 28a and 28d to each other; output E is connected to the conductor which connects relays 30a and 30b to each other; output F is connected to the conductor which connects relays 30b and 30c to each other; output G is connected to the conductor which connects relays 30c and 30d to each other; and output H is connected to the conductor which connects relays 30a and 30d to each other. In addition, the set of relays 28a-28d and 30a-30d has four sensing circuits 20a-20d associated therewith. Sensing circuit 20a is connected to the input line for relays 28a and 30a; sensing circuit 20b is connected to the output line for relays 28b and 30b; sensing circuit 20c is connected to the input line for relays 28c and 30c; and sensing circuit 20d is connected to the output line for relays 28d and 30d. In the example depicted in FIG. 10, because relay 28b is in an FTS state, when the stimulus MUX outputs a test voltage pulse on output A, sensing circuit 20a will sense a voltage of 15 V whereas sensing circuit 20b will sense a voltage of 0 V.

Each time an output terminal of the stimulus MUX is pulsed to apply a low voltage (15 V in the embodiment shown in FIG. 10) to a group of relays, the outputs from sensing circuits 20a-20d are received by the telemetry MUX. For example, if terminal D were pulsed, the outputs from sensing circuits 20a through 20d would be acquired, forming a set of test case data which can be compared to the associated telemetry signature in a pre-stored set of truth tables. If the test case data matches a telemetry signature associated with a particular fault, corrective action can be taken before the XIPS is turned on.

Returning to FIG. 9, the outputs (i.e., test case data 22) from the sensing circuits 20 are input to the telemetry MUX 24. Since the XPCs are off, the test voltage should only appear on the proper circuits as determined by the present XRU relay configuration. The pulses from the test pulse generator 14 are forwarded by the stimulus MUX 16 to the telemetry MUX 24, thereby synchronizing the telemetry with the test cases. When the telemetry data from the spacecraft is received on the ground after the testing has been completed, the spacecraft operator needs to have both the test case input and also the resulting output in order to have a complete understanding of the state of the XRUs. The Start/Stop and Test Case Encoding circuitry 18 is tied to the telemetry MUX 24 so that the spacecraft operator can readily determine what the exact stimulus was that resulted in a particular output.

The test case data 22 is encoded as a series of analog output pulses that are sent to an "Analog TM Out" port of the onboard computer 10. This test case data 22 can be monitored by the onboard computer 10 or transmitted for monitoring on the ground. If the telemetry pattern is not as desired for the XRU relay configuration, then an improper relay configuration can be deduced and appropriate corrective action can be taken. More specifically, prior to testing, telemetry detection truth tables in the form of charts can be generated which detail the expected telemetry, i.e., the expected states of the relays of interest. In particular, these truth tables show the expected telemetry signature for each of a multiplicity of possible major faults that would cause damage to the XPCs or thrusters. (The Type C relay configuration does not need a truth table. If a type C relay configuration suffers a fault, the XPC will not be allowed to turn on by internal XPC logic. Thus no damage will occur to the thruster, XPC or XRU.)

Figure 11:
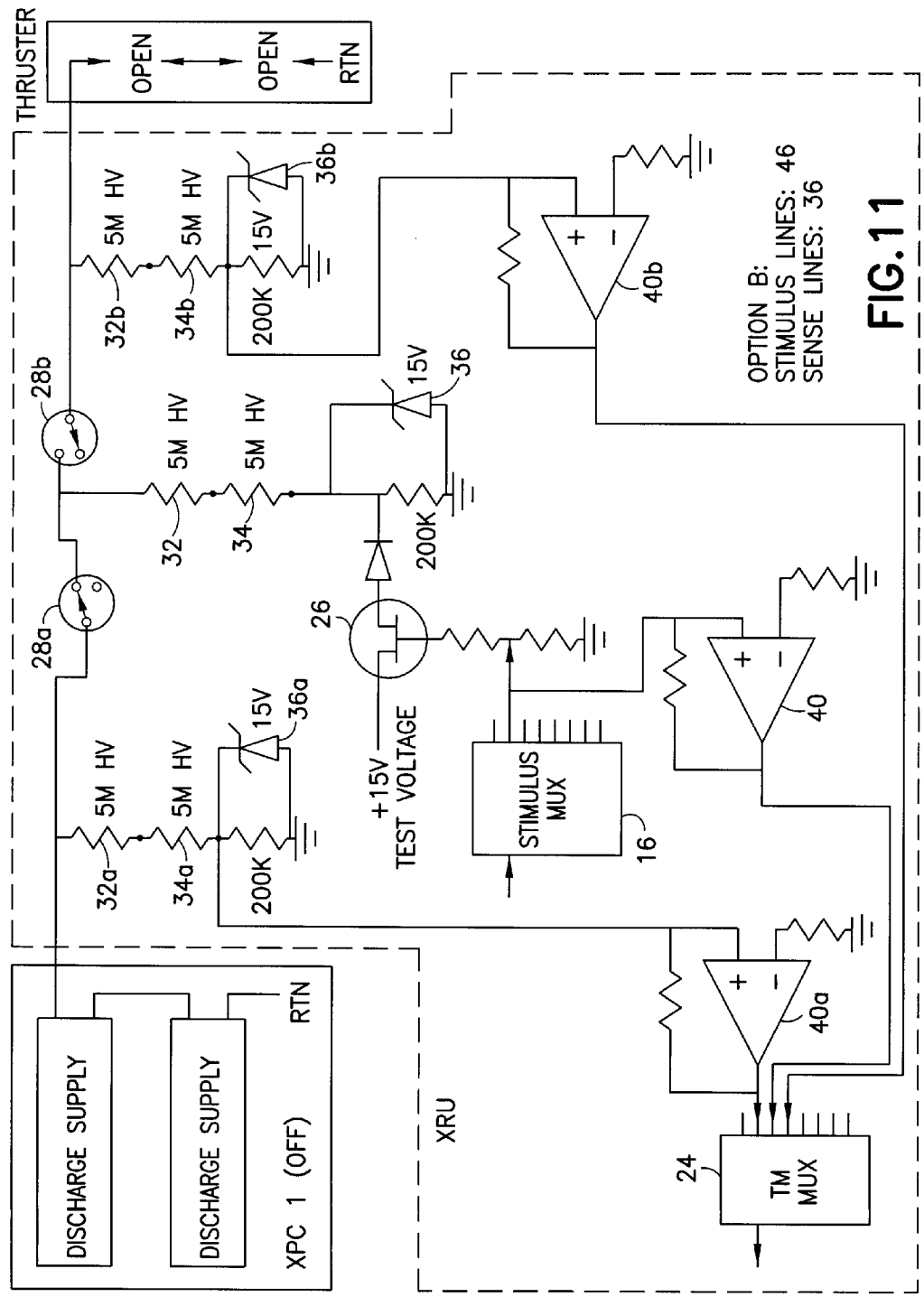
FIG. 11 is a schematic showing in more detail the structure of a test circuit installed in a discharge anode power connection circuit of an XRU when one relay has failed to switch. For the purpose of simplification, only one pair of relays from a Type A High Current relay configuration are shown.

FIG. 11 shows further details of a self-test circuit installed in a discharge anode power connection circuit of an XRU. For the purpose of simplification, only one pair of relays from a Type A High Current relay configuration are shown. Relay 29b is shown in an FTS state. As shown in FIG. 11, each output pulse from stimulus MUX 16 turns on a respective transistor 26, which applies a low voltage (e.g., 15 V) to each power connection circuit (in sequence) via a respective pair of high-voltage (e.g., 5-megaohm) resistors 32 and 34. These high-voltage resistors protect the self-test circuit when the high voltage is on during XIPS operation. As seen in FIG. 11, each transistor 26 has a respective Zener diode 36 associated therewith.

Still referring to FIG. 11, operational amplifier 40 corresponds to the Start/Stop and Test Case Encoding circuitry 18 shown in FIG. 9. The operational amplifier 40 receives the pulse from stimulus MUX 16 which switches transistor 26 on and outputs an encoded analog version of that pulse to the telemetry MUX 24.

The circuitry of two sensing circuits is also shown in FIG. 11. A first sensing circuit is connected to the input to relay 28a, while a second sensing circuit is connected to the output of relay 28b. The first sensing circuit comprises two series-connected high-voltage resistors 32a, 34a, a Zener diode 36a, and an operational amplifier 40a connected as shown, while the second sensing circuit comprises two series-connected high-voltage resistors 32b, 34b, a Zener diode 36b, and an operational amplifier 40b connected as shown. The signal output from operational amplifier 40a to the telemetry MUX 24 when transistor 26 is turned on indicates the state of relay 28a, while the signal output from operational amplifier 40b to the telemetry MUX 24 when transistor 26 is turned on indicates the state of relay 28b.

The Zener diodes 36, 36a and 36b allow for a larger sensing voltage while preventing the sensing points from exceeding the telemetry circuit's maximum voltage when the high voltage is on. Without the Zener diodes, the voltage applied during the self-test operation would need to be lower.

If testing reveals that the XRU relay configurations are correct, the XIPS can be then be turned on to perform the required spacecraft maneuver. The power supplies that power up a selected thruster are provided by one of the XPCs. The 4.5 kilowatts of power sent to the selected thruster from the XPC is switched by the appropriate XRU. The power supplies from the XPC are turned on and off by the on-board computer (item 10 in FIG. 9), but the fine adjustments of the output power, for the purpose of keeping the thruster's operation stable, are done internally in the XPC; the on-board computer merely commands the XPC to start and stop the thruster power.

The ion propulsion system is preferably designed to allow switching of voltages up to 2000 volts and associated currents up to 25 amperes.

While ion propulsion systems have been described with reference to particular embodiments, it will be understood by those skilled in the art that various changes may be made and equivalents may be substituted for elements thereof without departing from the scope of the teachings herein. In addition, many modifications may be made to adapt a particular situation to the teachings herein without departing from the essential scope thereof. Therefore it is intended that the claims set forth hereinafter not be limited to the disclosed embodiments.

As used in the claims, the term "computer system" should be construed broadly to encompass a system having at least one computer or processor, and which may have two or more interconnected computers or processors.

The method claims set forth hereinafter should not be construed to require that the steps recited therein be performed in alphabetical order or in the order in which they are recited. Nor should they be construed to exclude any portions of two or more steps being performed concurrently.

The invention claimed is:

1. An ion propulsion system comprising first and second power controllers making available a high-voltage power, first and second ion thrusters and a multiplicity of high-voltage relays, said multiplicity of high-voltage relays having first and second switch states, said first and second power controllers being connected to provide high-voltage power to said first and second thrusters respectively when said multiplicity of high-voltage relays are in said first switch state, said first and second power controllers being connected to provide high-voltage power to said second and first thrusters respectively when said multiplicity of high-voltage relays are in said second switch state, said system further comprising a low-voltage power supply making available a low-voltage power and low-voltage self-test circuitry which is capable of selectively providing said low-voltage power to said high-voltage relays of said multiplicity and detecting voltages in respective conductors of said high-voltage relays when said low-voltage power is provided.

2. The ion propulsion system as recited in claim 1, further comprising a computer system which is connected and programmed to perform the following operations: initiating the selective providing of low-voltage power to said high-voltage relays by said low-voltage self-test circuitry; and
   processing voltages detected by said low-voltage self-test circuitry when said low-voltage power is provided to said high-voltage relays.

3. The ion propulsion system as recited in claim 1, wherein said low-voltage self-test circuitry comprises:
   a pulse generator;
   a stimulus circuit connected to receive pulses generated by said pulse generator;
   a first low-voltage switch connected to said low-voltage power supply and controlled by a pulse from said stimulus circuit, wherein a first high-voltage relay of said multiplicity of high-voltage relays receives a low-voltage pulse from said low-voltage power supply when said first low-voltage switch is turned on by said pulse from said stimulus circuit;
   a first sensing circuit for detecting a first voltage in a conductor of said first high-voltage relay when said low-voltage pulse is received by said first high-voltage relay; and
   a telemetry output circuit connected to said first sensing circuit.

4. The ion propulsion system as recited in claim 3, further comprising a second low-voltage switch, wherein said stimulus circuit comprises a multiplexer having an input terminal connected to said pulse generator and first and second output terminals respectively connected to said first and second low-voltage switches.

5. The ion propulsion system as recited in claim 3, further comprising a second sensing circuit, wherein said telemetry output circuit comprises a multiplexer having an output terminal and first and second input terminals respectively connected to said first and second sensing circuits.

6. The ion propulsion system as recited in claim 3, wherein said first sensing circuit outputs an encoded analog signal indicative of a state of said first high-voltage relay when said low-voltage pulse is received by said first high-voltage relay.

7. The ion propulsion system as recited in claim 3, further comprising high-voltage resistors which protect the stimulus and sensing circuits.

8. The ion propulsion system as recited in claim 3, wherein a second high-voltage relay of said multiplicity of high-voltage relays also receives said low-voltage pulse from said low-voltage power supply when said first low-voltage switch is turned on by said pulse from said stimulus circuit, further comprising a second sensing circuit for detecting a second voltage in a conductor of said second high-voltage relay when said low-voltage pulse is received by said second high-voltage relay.

9. An electronic system configured to deliver high-voltage power to either of first and second electronic devices of an ion propulsion system, comprising:
   a high-voltage power supply making available said high-voltage power;
   a multiplicity of high-voltage switching circuits, said multiplicity of high-voltage switching circuits having first and second switch states, wherein said multiplicity of high-voltage switching circuits in said first switch state provides said high-voltage power to said first electronic device and electrically isolates said second electronic device from said high-voltage power supply, and wherein said multiplicity of high-voltage switching circuits in said second switch state provides said high-voltage power to said second electronic device and electrically isolates said first electronic device from said high-voltage power supply;
   a low-voltage power supply providing low-voltage power; and
   low-voltage self-test circuitry which is capable of selectively providing said low-voltage power to said high-voltage switching circuits and to detect voltages in respective first conductors of said high-voltage switching circuits arising from the application of said low-voltage power to said high-voltage switching circuits.

10. The electronic system as recited in claim 9, further comprising a computer system which is connected and programmed to perform the following operations: initiating the selective providing of low-voltage power to said high-voltage switching circuits by said low-voltage self-test circuitry; and
    processing the respective voltages detected by said low-voltage self-test circuitry when said low-voltage power is provided to said high-voltage switching circuits.

11. The electronic system as recited in claim 9, wherein said high-voltage switching circuits comprise relays.

12. The electronic system as recited in claim 9, wherein said low-voltage self-test circuitry comprises:
    a pulse generator;
    a stimulus circuit connected to receive pulses generated by said pulse generator;
    a first low-voltage switch connected to said low-voltage power supply and controlled by a pulse from said stimulus circuit, wherein a first high-voltage switching circuit of said multiplicity of high-voltage switching circuits receives a low-voltage pulse from said low-voltage power supply when said first low-voltage switch is turned on by said pulse from said stimulus circuit;
    a first sensing circuit for detecting a voltage in a conductor of said first high-voltage switching circuit when said low-voltage pulse is received by said first high-voltage switching circuit; and
    a telemetry output circuit connected to said first sensing circuit.

13. The electronic system as recited in claim 12, further comprising a second low-voltage switch and a second sensing circuit, wherein said stimulus circuit comprises a first multiplexer having an input terminal connected to said pulse generator and first and second output terminals respectively connected to said first and second low-voltage switches; and said telemetry output circuit comprises a second multiplexer having an output terminal and first and second input terminals respectively connected to said first and second sensing circuits.

14. A self-testing electronic circuit method for detecting the state of each of the high-voltage switching circuits in the electronic system of claim 9, wherein the high-voltage switching circuits further comprise respective second and third conductors, each respective high-voltage switching circuit having at least a respective first state in which the respective first conductor is connected to the respective second conductor and a respective second state in which the respective first conductor is connected to the respective third conductor, the method comprising:
 (a) applying a first low voltage to the respective second conductor of one of the respective high-voltage switching circuits; and
 (b) sensing a respective first voltage at the respective first conductor of the one of the respective high-voltage switching circuits when the first low voltage is applied to the respective second conductor.

15. The method as recited in claim 14, further comprising:
 (c) applying a second low voltage to the respective third conductor of the one of the respective high-voltage switching circuits; and
 (d) sensing the respective second voltage at the respective first conductor of the one of the respective high-voltage switching circuits when the second low voltage is applied to the respective third conductor.

16. The method as recited in claim 15, further comprising:
 (e) determining whether or not each of the sensed respective first and second voltages equals zero; and
 (f) generating an error signal in response to a determination that each of the sensed respective first and second voltage equals zero.

17. A method for self-testing by an electronic system of claim 9, comprising:
 applying a low-voltage test voltage in sequence to other respective conductors of said multiplicity of high-voltage switching circuits; and
 sensing the respective voltages which occur at the respective first conductors of said multiplicity of high-voltage switching circuits when the low-voltage test voltages are applied.

18. The method as recited in claim 17, wherein the electronic system is onboard an orbiting spacecraft.

19. The method as recited in claim 18, further comprising transmitting encoded data from the spacecraft to ground, said data being encoded to indicate the sensed voltages.

20. The method as recited in claim 17, further comprising:
 determining whether or not the respective voltages as sensed indicate an error condition; and
 taking action to correct the error condition prior to delivering high-voltage power to said high-voltage switching circuits.

21. The method as recited in claim 20, wherein each high-voltage switching circuit comprises a relay and said error condition is an improper relay configuration.

* * * * *